United States Patent [19]

Stricklin et al.

[11] Patent Number: 5,451,933
[45] Date of Patent: Sep. 19, 1995

[54] COMPUTER CARD HAVING POWER SWITCHING CAPABILITY

[75] Inventors: Douglas M. Stricklin, Boynton Beach; William R. VanDyke, Jr., Lighthouse Point; Gregory W. Fuller, Boca Raton, all of Fla.

[73] Assignee: Motorola, Inc., Schaumburg, Ill.

[21] Appl. No.: 300,664

[22] Filed: Sep. 6, 1994

Related U.S. Application Data

[63] Continuation of Ser. No. 963,341, Oct. 19, 1992, abandoned.

[51] Int. Cl.$^6$ .................... G11C 14/00; G05B 23/02
[52] U.S. Cl. .................. 340/825.06; 340/825.33; 365/229; 361/737
[58] Field of Search .............. 307/64, 66, 85–86, 307/113, 140, 150; 364/229; 365/229; 361/737; 340/825.33, 825.06

[56] References Cited

U.S. PATENT DOCUMENTS

| | | | |
|---|---|---|---|
| 4,962,485 | 10/1990 | Kato et al. | 365/229 |
| 5,043,721 | 8/1991 | May . | |
| 5,058,075 | 10/1991 | Mizuta | 307/64 |
| 5,070,258 | 12/1991 | Izumi et al. | 361/737 |
| 5,229,650 | 7/1993 | Kita et al. | 307/64 |
| 5,243,577 | 9/1993 | Ueda et al. | 307/64 |
| 5,247,205 | 9/1993 | Mototani et al. | 307/64 |
| 5,347,164 | 9/1994 | Yeh | 307/64 |

OTHER PUBLICATIONS

"PC Card Standard", Release 2.0, published Sep., 1991 by the Personal Computer Memory Card International Association of Sunnyvale, California.

Primary Examiner—Donald J. Yusko
Assistant Examiner—David Yiuk Jung
Attorney, Agent, or Firm—Kelly A. Gardner; John H. Moore; Daniel K. Nichols

[57] ABSTRACT

An electronic device having electronic circuitry powered by a battery and having an interface for interactively coupling the electronic device to a host device, for switching the power source by which power is supplied to the electronic circuitry, and by determining (410) an interface status as being coupled to or detached from the host device. In response to determining (410) that the interface is coupled to the host device, the electronic circuit is coupled (415) to the interface such that power is supplied to the electronic circuitry from the host device. In response to determining (410) that the interface is detached from the host device, the electronic circuit is coupled (420) to the battery.

12 Claims, 5 Drawing Sheets

FIG. 3

| Pin | Signal | I/O | Function | +/- |
|---|---|---|---|---|
| 1 | GND | | Ground | |
| 2 | D3 | I/O | Data bit 3 | |
| 3 | D4 | I/O | Data bit 4 | |
| 4 | D5 | I/O | Data bit 5 | |
| 5 | D6 | I/O | Data bit 6 | |
| 6 | D7 | I/O | Data bit 7 | |
| 7 | CE1 | I | Card enable | - |
| 8 | A10 | I | Address bit 10 | |
| 9 | OE | I | Output enable | - |
| 10 | A11 | I | Address bit 11 | |
| 11 | A9 | I | Address bit 9 | |
| 12 | A8 | I | Address bit 8 | |
| 13 | A13 | I | Address bit 13 | |
| 14 | A14 | I | Address bit 14 | |
| 15 | WE/PGM | I | Write enable | - |
| 16 | RDY/BSY | O | Ready/Busy | +/- |
| 17 | Vcc | | Power Supply | |
| 18 | Vpp1 | | Programming and Peripheral Supply | |
| 19 | A16 | I | Address bit 16 | |
| 20 | A15 | I | Address bit 15 | |
| 21 | A12 | I | Address bit 12 | |
| 22 | A7 | I | Address bit 7 | |
| 23 | A6 | I | Address bit 6 | |
| 24 | A5 | I | Address bit 5 | |
| 25 | A4 | I | Address bit 4 | |
| 26 | A3 | I | Address bit 3 | |
| 27 | A2 | I | Address bit 2 | |
| 28 | A1 | I | Address bit 1 | |
| 29 | A0 | I | Address bit 0 | |
| 30 | D0 | I/O | Data bit 0 | |
| 31 | D1 | I/O | Data bit 1 | |
| 32 | D2 | I/O | Data bit 2 | |
| 33 | WP | O | Write protect | + |
| 34 | GND | | Ground | |

FIG. 4

| Pin | Signal | I/O | Function | +/- |
|---|---|---|---|---|
| 35 | GND | | Ground | |
| 36 | CD1 | O | Card Detect | - |
| 37 | D11 | I/O | Data bit 11 | |
| 38 | D12 | I/O | Data bit 12 | |
| 39 | D13 | I/O | Data bit 13 | |
| 40 | D14 | I/O | Data bit 14 | |
| 41 | D15 | I/O | Data bit 15 | |
| 42 | CE2 | I | Card enable | - |
| 43 | RFSH | I | Refresh | |
| 44 | RFU | | Reserved | |
| 45 | RFU | | Reserved | |
| 46 | A17 | I | Address bit 17 | |
| 47 | A18 | I | Address bit 18 | |
| 48 | A19 | I | Address bit 19 | |
| 49 | A20 | I | Address bit 20 | |
| 50 | A21 | I | Address bit 21 | |
| 51 | Vcc | | Power Supply | |
| 52 | Vpp2 | | Programming and Peripheral Supply 2 | |
| 53 | A22 | I | Address bit 22 | |
| 54 | A23 | I | Address bit 23 | |
| 55 | A24 | I | Address bit 24 | |
| 56 | A25 | I | Address bit 25 | |
| 57 | RFU | | Reserved | |
| 58 | RESET | I | Card Reset | + |
| 59 | WAIT | O | Extend bus cycle | - |
| 60 | RFU | | Reserved | |
| 61 | REG | I | Register select | - |
| 62 | BVD2 | O | Battery voltage detect 2 | |
| 63 | BVD1 | O | Battery voltage detect 1 | |
| 64 | D8 | I/O | Data bit 8 | |
| 65 | D9 | I/O | Data bit 9 | |
| 66 | D10 | I/O | Data bit 10 | |
| 67 | CD2 | O | Card detect | - |
| 68 | GND | | Ground | |

COMPUTER CARD HAVING POWER SWITCHING CAPABILITY

This is a continuation of application Ser. No. 07/963,341, filed Oct. 19, 1992 now abandoned.

FIELD OF THE INVENTION

This invention relates in general to computer cards, and more specifically to a computer card which may be selectively powered by either a battery or a host computer into which the card is inserted.

BACKGROUND OF THE INVENTION

Conventionally, users of computing devices, such as personal computers, utilize computer cards which are inserted into the host computer to provide hardware expansion or peripheral functions. For example, computer cards may provide memory expansion, data storage, or input/output functions. Many of these computer cards are manufactured in accordance with PCMCIA (Personal Computer Memory Card International Association) standards and are therefore referred to as PCMCIA cards. PCMCIA cards utilize a standardized sixty-eight (68) pin interface for easy interchangeability between different host computers.

Computer cards are typically powered by a battery, which provides power for operations such as memory retention and peripheral functions. Because of their typically small size, conventional computer cards utilize a very small battery, the capacity of which varies inversely with the amount of current supplied by the battery. The use of the smaller battery is generally not critical in computer cards which are employed solely as data storage devices because data storage functions typically use small enough amounts of current that the battery may last for several years.

However, computer cards which provide peripheral functions, i.e., functions in addition to data storage, may require a much larger amount of current. As a result, the battery included within a computer card which provides peripheral functions, i.e., a peripheral card, may be depleted more quickly than the battery included within a computer card having only data storage functions. By way of example, a peripheral card such as a radio frequency (RF) modem, which receives and processes RF signals, typically requires a relatively large amount of current to perform the peripheral operations. This large amount of current must be supplied by the battery not only when the card is detached from the host computer, but also when the card is coupled to the host computer. As a result, the battery life of a battery utilized by such a computer card is usually relatively short.

Thus, what is needed is a computer card, such as a PCMCIA card, which, when coupled to a host computer, is powered by the host computer, thereby increasing the life of the battery utilized by the computer card.

SUMMARY OF THE INVENTION

According to an aspect of the present invention, a battery powered electronic device for coupling to a host device performs operational functions both when coupled to and disconnected from the host device. The electronic device comprises a battery for normally powering the operational functions performed by the battery powered electronic device, an interface comprising data transmission means for transmitting data and power receiving means for receiving power from the host device, and electronic circuitry for performing the operational functions, including receiving information and generating the data.

The electronic circuitry includes interface monitoring means coupled to the interface for determining an interface status as being active or inactive. Power switching means coupled to the interface monitoring means couples the electronic circuitry to the battery in response to the interface monitoring means determining that the interface is inactive and couples the electronic circuitry to the power receiving means in response to the interface monitoring means determining that the interface is active. The power for performing the operational functions is provided by the battery when the interface is inactive and by the host device when the interface is active. The power switching means operates irrespective of an external supply voltage level of the power supplied by the host device.

BRIEF DESCRIPTION OF THE DRAWINGS

FIGS. 3 and 4 are charts depicting the pin assignments for the interface included in the data communication receiver of FIG. 1 in accordance with the preferred embodiment of the present invention.

DESCRIPTION OF A PREFERRED EMBODIMENT

Figure 1:
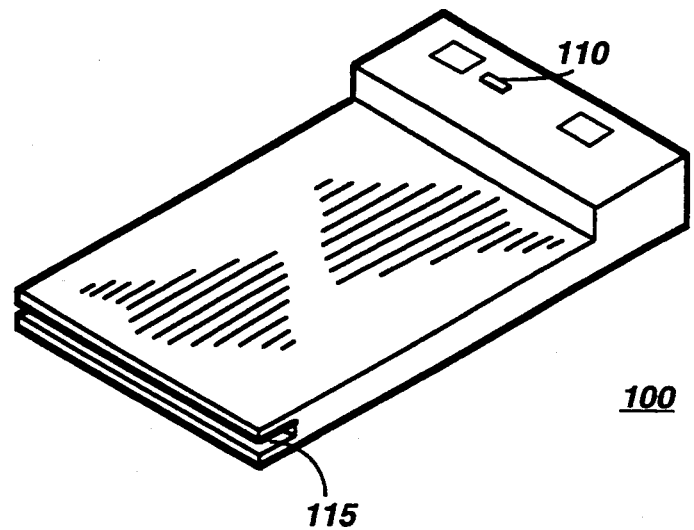
FIG. 1 is an illustration of a data communication receiver in accordance with a preferred embodiment of the present invention.

Referring to FIG. 1, a computer card, preferably manufactured in accordance with PCMCIA (Personal Computer Memory Card International Association) standards, is depicted. This computer card may be a memory expansion card or, in accordance with a preferred embodiment of the present invention, a peripheral card such as a data communication receiver 100. The data communication receiver 100 preferably receives a radio frequency (RF) signal and recovers a selective call message contained therein. The selective call message is stored by the data communication receiver 100 and thereafter may be processed in response to user manipulation of controls 110 located on the exterior of the data communication receiver 100. Alternatively, the selective call message may be automatically transferred, via a standard PCMCIA 68 pin interface 115, to a host computer, as may be better understood by referring to FIG. 2.

Figure 2:
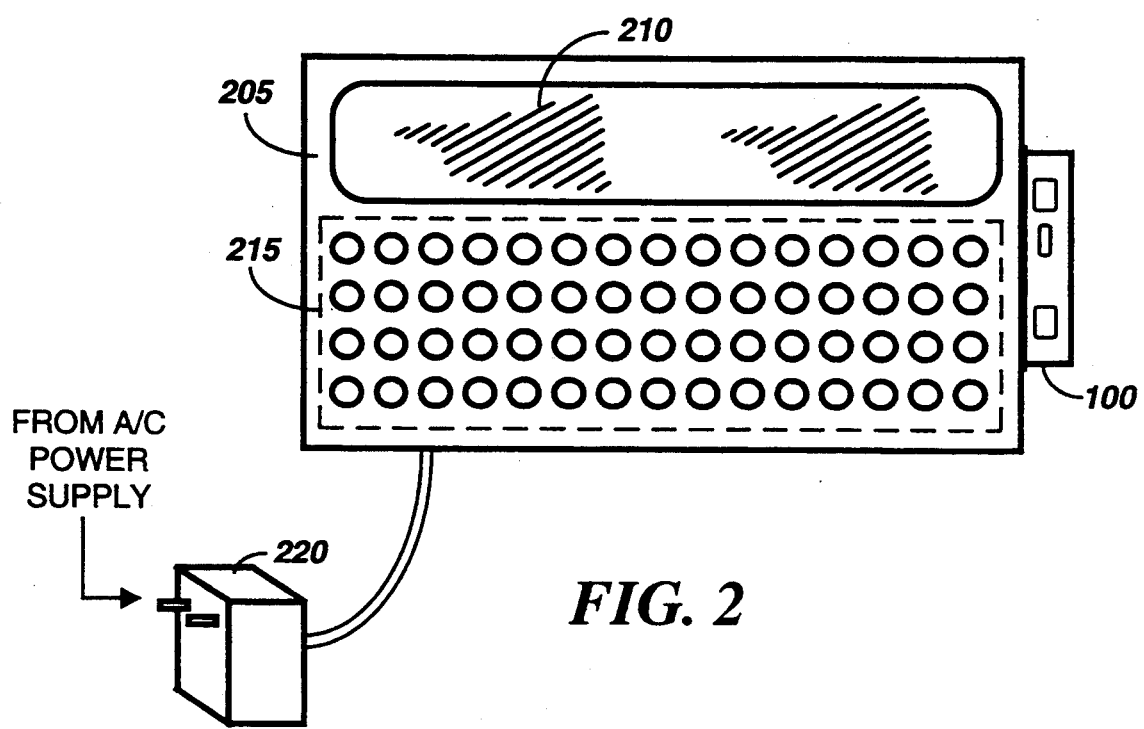
FIG. 2 is an illustration of the interactive coupling of the data communication receiver of FIG. 1 to a host computer in accordance with the preferred embodiment of the present invention.

FIG. 2 depicts the interactive coupling of the data communication receiver 100 to a host computer 205. As shown, the data communication receiver 100 is inserted within a card-receiving pocket wherein the card interface 115 (FIG. 1) electrically couples with a computer interface located within the card-receiving pocket. In this position., data, such as selective call messages, is transferred to the host computer 205 via the card interface 115 and the computer interface. Thereafter, according to the present invention, the transferred data is displayed on the monitor 210 of the host computer 205 either manually, when commands are entered on a computer keyboard 215, or automatically. Additionally, information may be transferred from the host computer 205 to the data communication receiver 100. Preferably, a conventional power plug 220 is plugged into an electrical outlet to provide power to the host computer 205, although the host computer 205 may be alternatively powered by a battery pack (not shown).

FIGS. 3 and 4 depict the pin assignments of the card interface 115, which, as described above, is manufactured in accordance with PCMCIA standards. As shown, data is transferred between the host computer 205 and the data communication receiver on input/output pins 2–6, 30–32, 37–41, and 64–66. Additionally, a VCC pin, pin 17, receives a predetermined voltage from the host computer 205 when the data communication receiver 100 is coupled to the host computer 205. Therefore, the data communication receiver 100 is able to determine whether or not it is coupled to the host computer 205.

Figure 5:
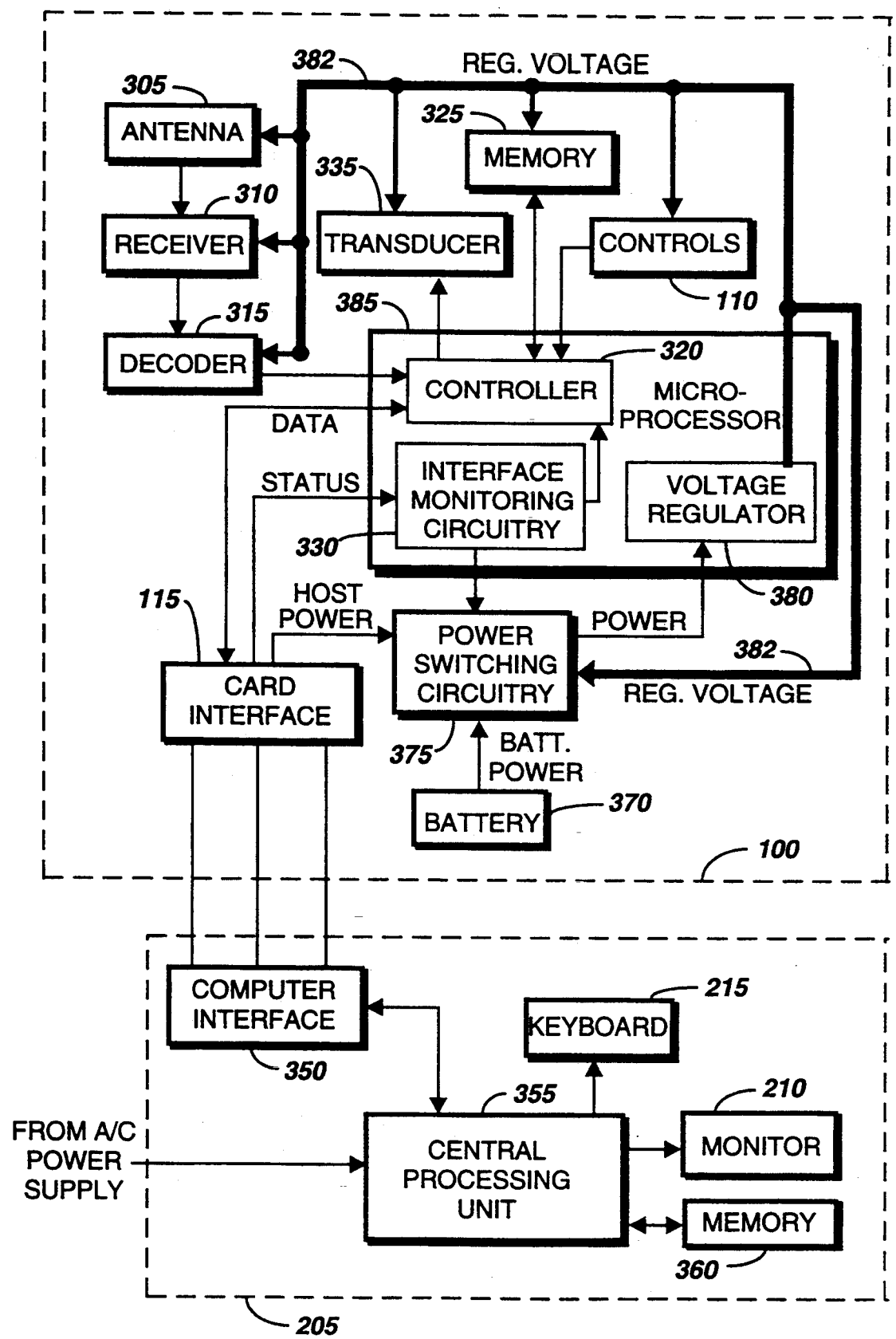
FIG. 5 is an electrical block diagram of the data communication receiver of FIG. 1 and the host computer of FIG. 2 while interactively coupled in accordance with the preferred embodiment of the present invention.

Referring next to FIG. 5, an electrical block diagram depicts the interactive coupling of the data communication receiver 100 to the host computer 205. In accordance with the preferred embodiment of the present invention, the data communication receiver 100 comprises an antenna 305 for receiving an RF signal and a receiver 310 coupled to the antenna 305 for demodulating the RF signal. A decoder 315 coupled to the receiver 310 recovers an address and a selective call message included within the RF signal and provides the recovered address and selective call message to a controller 320, which thereafter compares the recovered address with addresses stored in a memory 325. If the recovered address is equivalent to one of the stored addresses, indicating that the selective call message is intended for reception by the data communication receiver 100, the controller 320 stores the selective call message in the memory 325.

As described above, the data communication receiver 100 includes a PCMCIA card interface 115 by which the data communication receiver 100 is coupled to the host computer 205, thus providing for the transfer of data between the host computer 205 and the data communication receiver 100. According to the present invention, the card interface 115 is monitored by interface monitoring circuitry 330, which determines the interface status as being active, i.e., the card interface 115 is coupled to the host computer 205, or inactive, i.e., the card interface 115 is not coupled to the host computer 205. The interface status may be determined by monitoring the voltage at pin 17 of the card interface 115.

When the card interface 115 is determined to be inactive, the interface monitoring circuitry 330 provides an "inactive" signal to the controller 320. Thereafter, upon reception of a selective call message, the controller 320 transmits an activation signal to a transducer 335, in response to which the transducer 335 generates a sensible alert to announce reception of the selective call message.

When the card interface is active, an "active" signal is provided by the interface monitoring circuitry 330 to the controller 320, in response to which the stored selective call message is transferred to the card interface 115 for transmission, over one of the input/output pins, to the host computer 205. Preferably, the selective call message is received by the computer interface 350 and provided to a central processing unit (CPU) 355 included within the host computer 205. The selective call message is provided by the CPU 355 to a memory 360 for storage and is subsequently retrieved by the CPU 355 and provided to the monitor 210 for presentation. The selective call message may be provided to the monitor 210 either automatically, upon reception by the CPU 355, or manually, when the computer keyboard 215 is used to enter a user-initiated command. In this manner, selective call messages may be conveniently displayed on the monitor 210, which is typically large enough to display even lengthy selective call messages as a single block of text.

In accordance with the preferred embodiment of the present invention, power is supplied to the data communication receiver 100 either by a battery 370 included within the data communication receiver 100 or by the host device 205. If the card interface 115 is determined to be inactive, i.e., the card interface 115 is not coupled to the computer interface 350, the interface monitoring circuitry 330 sends a "battery" signal to power switching circuitry 375, which is coupled to the card interface 115 and the battery 370. In response to reception of the "battery" signal, the power switching circuitry 375 electrically couples the battery 370 to a voltage regulator 380. Alternatively, if the card interface 115 is determined to be active, the interface monitoring circuitry 330 sends a "host" signal to the power switching circuitry 375, in response to which the power switching circuitry 375 electrically couples power pins (VPP pins 18 and 52) of the card interface 115 to the voltage regulator 380. Regardless of the power source, the voltage regulator 380 provides a regulated voltage to a regulated voltage bus 382 by which the regulated voltage is supplied to the other circuitry included within the data communication receiver 100. According to the present invention, the voltage regulator 380, the controller 320, and the interface monitoring circuitry 330 are internal to a microprocessor 385, such as a Motorola MC68HC05C8 microcomputer, although it may be appreciated that such circuitry may be hard-wired logic capable of performing the described functions.

As described above, the CPU 355 of the host computer 205 is coupled to and receives power from a power source, such as a conventional electrical outlet. In addition to processing selective call messages, the CPU 355 preferably provides a predetermined voltage to the computer interface 350 in a manner well known to one skilled in the art. When the data communication receiver 100 is coupled to the host computer 205, the power pins of the card interface 115 are electrically connected to the computer interface 350 and receive the predetermined voltage therefrom. This voltage is thereafter utilized to power the data communication receiver 100 when coupled to the host computer 205.

In accordance with the preferred embodiment of the present invention, the data communication receiver 100 is supplied with power from the host computer 205 when coupled to the host computer 205. As a result, the battery 370, which is of minimal size and capacity, is only utilized, and therefore depleted, when the data communication receiver 100 is detached from the host computer 205. Such a feature, i.e., the reception of power from the host computer 205, is extremely advantageous for use in the data communication receiver 100, which, when performing operations such as receiving, processing, and alerting, consumes a relatively large amount of current. In addition, other computer cards would also benefit from the ability to receive power from a host computer when coupled to the host computer because they, like the data communication receiver 100, utilize small, low capacity batteries. Therefore, if, when coupled to a host computer, other computer cards could receive power therefrom, battery life of the computer cards could be extended.

Figure 6:
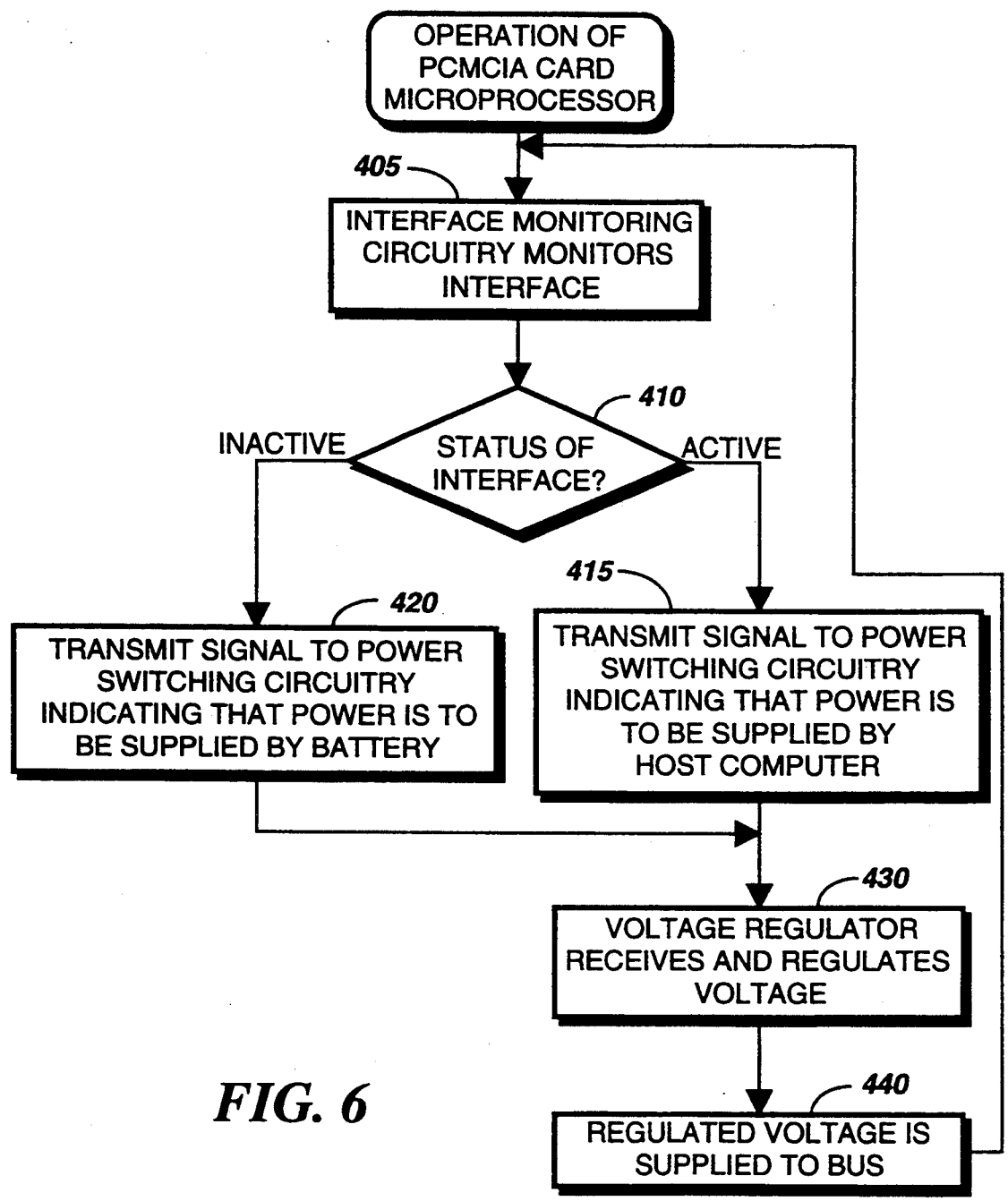
FIG. 6 is a flowchart depicting the power switching operation of the microprocessor of the data communication receiver of FIG. 1 in accordance with the preferred embodiment of the present invention.

Referring next to FIG. 6, a flowchart depicts the operation of the microprocessor 385 of the data communication receiver 100. In accordance with the preferred embodiment of the present invention, the interface monitoring circuitry 330 (FIG. 3) continually monitors, at step 405, the microprocessor port to which the card interface 115 is coupled. If the interface monitoring circuitry 330 determines, at step 410, that the card interface is active, i.e., the data communication receiver 100 is coupled to the host computer 205, a "host" signal is transmitted, at step 415, to the power switching circuitry 375. In response to reception of the signal, the power switching circuitry 375 couples the card interface 115 to the voltage regulator 380 (FIG. 3) such that power is received from the host computer 205. If the interface monitoring circuitry 330 determines, at step 410, that the card interface 115 is inactive, i.e., the data communication receiver 100 is detached from the host computer 205, a "battery" signal is transmitted, at step 420, to the power switching circuitry 375, in response to which the battery 370 is coupled to the voltage regulator 380. Therefore, when the data communication receiver 100 is not coupled to the host computer 205, the battery 370 powers the data communication receiver 100.

According to the present invention, the voltage regulator 380 receives and regulates, at step 430, the voltage from either source, i.e., the battery 370 or the card interface 115. The regulated voltage is thereafter supplied, at step 440, to the regulated voltage bus 382 (FIG. 3), which provides power to other circuitry within the data communication receiver 100.

In summary, the computer card in accordance with the preferred embodiment of the present invention, i.e., the data communication receiver, may be powered by a first power source or a second power source. Preferably, when the computer card is operating independently, interface monitoring circuitry within the computer card determines that the card interface is not coupled to a host computer. In response to this determination, the computer card is powered by an internal battery. Because of the small size of the computer card, however, the battery is very small and thus has only minimal capacity. As a result, the battery is unable to power the computer card for long periods of time. To alleviate this problem, the computer card according to the present invention is, when coupled to a host computer, powered by the host computer rather than the battery. Therefore, when the computer card is coupled to a host computer, the battery is not depleted during operation of the computer card.

This feature is especially advantageous for use in the data communication receiver according to the present invention, which is intended for operation both when coupled to and detached from the host computer. Because operation of the data communication receiver, i.e., receiving, processing, alerting, etc., consumes relatively large amounts of current, the available battery capacity may decrease quickly when the data communication receiver is detached from the host computer. However, when the data communication receiver is coupled to the host computer, power to operate the data communication receiver is supplied by the host computer and the internal battery is not depleted.

A conventional computer card, unlike the computer card in accordance with the preferred embodiment of the present invention, is unable to receive power from a host computer to which it is coupled. Therefore, the internal battery of the computer card is drained even when the computer card is coupled to the host computer. As a result, the life of a battery utilized by a conventional computer card is usually much less than that of a battery utilized by the computer card according to the present invention. This decreased battery life typically results in increased expense for the user of the computer card, as the battery must be replaced often.

By now it may be appreciated that there has been provided a computer card, such as a PCMCIA card, which, when coupled to a host computer, is powered by the host computer, thereby increasing the life of the battery utilized by the computer card.

We claim:

1. A battery powered electronic device for coupling to a host device for performing operational functions both when coupled to and disconnected from the host device, the electronic device comprising:

a battery for normally powering the operational functions performed by the battery powered electronic device:

an interface comprising data transmission means for transmitting data and power receiving means for receiving power from the host device; and electronic circuitry for performing the operational functions, including receiving information and generating the data, comprising:

interface monitoring means coupled to the interface for determining an interface status as being active or inactive; and power switching means coupled to the interface monitoring means for coupling the electronic circuitry to the battery in response to the interface monitoring means determining that the interface is inactive and for coupling the electronic circuitry to the power receiving means in response to the interface monitoring means determining that the interface is active, wherein the power for performing the operational functions is provided by the battery when the interface is inactive, wherein the power for performing the operational functions is provided by the host device when the interface is active, and wherein the power switching means operates irrespective of an external supply voltage level of the power supplied by the host device.

2. The electronic device in accordance with claim 1, wherein the electronic circuitry further comprises voltage regulating means coupled to the battery and the power receiving means for regulating the power supplied thereby.

3. The electronic device in accordance with claim 1, wherein the electronic circuitry further comprises:

receiving means for receiving a radio frequency (RF) signal and recovering therefrom a selective call message, wherein the receiving means is powered by the battery when the interface is inactive and by the host device when the interface is active; and a memory coupled to the receiving means for storing the selective call message.

4. The electronic device in accordance with claim 3, wherein the electronic circuitry further comprises control means coupled to the receiving means and the memory for generating control signals to control the operation thereof, wherein the memory transfers the selective call message to the interface in response to reception of a control signal generated by the control means.

5. The electronic device in accordance with claim 3, wherein the receiving means comprises:
an antenna for receiving the RF signal;
a receiver coupled to the antenna for demodulating the RF signal; and
a decoder coupled to the receiver for recovering the selective call message from the demodulated signal.

6. The electronic device in accordance with claim 3, wherein the electronic circuitry further comprises an annunciator coupled to the receiving means for generating a sensible alert in response to reception of the selective call message.

7. The electronic device in accordance with claim 3, wherein the electronic circuitry further comprises presenting means coupled to the memory for presenting the selective call message to a user.

8. A battery powered data communication receiver for coupling to a host device for performing operational functions both when coupled to and disconnected from the host device, the data communication receiver, comprising:
a battery for normally powering the operational functions performed by the battery powered data communication receiver:
an interface comprising data transmission means for transmitting data and power receiving means for receiving power from the host device; and
electronic circuitry for performing the operational functions, including generating the data, comprising:
interface monitoring means coupled to the interface for determining an interface status as being active or inactive;
power switching means coupled to the interface monitoring means for coupling the electronic circuitry to the battery in response to the interface monitoring means determining that the interface is inactive and for coupling the electronic circuitry to the power receiving means such that the electronic circuitry is powered thereby in response to the interface monitoring means determining that the interface is active, wherein the power switching means operates irrespective of an external supply voltage level of the power supplied by the host device;
control means coupled to the interface monitoring means and the power switching means for generating control signals to control the operation of the electronic circuitry;
receiving means coupled to the control means for receiving a radio frequency (RF) signal and recovering therefrom a selective call message, wherein the receiving means is powered by the battery when the interface is inactive and by the host device when the interface is active; and
a memory coupled to the receiving means and the control means for storing the selective call message and for transferring the selective call message to the interface in response to reception of a first control signal generated by the control means.

9. The data communication receiver in accordance with claim 8, wherein the electronic circuitry further comprises voltage regulating means coupled to the battery and the power receiving means for regulating the power supplied thereby.

10. The data communication receiver in accordance with claim 8, wherein the electronic circuitry further comprises an annunciator coupled to the receiving means for generating a sensible alert in response to reception of the selective call message.

11. The data communication receiver in accordance with claim 8, wherein the electronic circuitry further comprises a presentation device coupled to the control means and the memory for presenting the selective call message to a user in response to reception of a second control signal generated by the control means.

12. The data communication receiver in accordance with claim 8, wherein the receiving means comprises:
an antenna for receiving the RF signal;
a receiver coupled to the antenna for demodulating the RF signal; and
a decoder coupled to the receiver for recovering the selective call message from the demodulated signal.

* * * * *